(12) United States Patent
Luo

(10) Patent No.: US 10,762,821 B1
(45) Date of Patent: Sep. 1, 2020

(54) DISPLAY PANEL AND DISPLAY APPARATUS

(71) Applicant: Xiamen Tianma Micro-Electronics Co., Ltd., Xiamen (CN)

(72) Inventor: Xiaodong Luo, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 16/663,804

(22) Filed: Oct. 25, 2019

(30) Foreign Application Priority Data

Apr. 30, 2019 (CN) .......................... 2019 1 0359453

(51) Int. Cl.
   *G09G 3/20*   (2006.01)
   *G06F 3/041*  (2006.01)
   *H01L 27/12*  (2006.01)
   *H01L 27/02*  (2006.01)

(52) U.S. Cl.
   CPC ............ *G09G 3/20* (2013.01); *G06F 3/0412* (2013.01); *H01L 27/0266* (2013.01); *H01L 27/0296* (2013.01); *H01L 27/124* (2013.01); *G09G 2300/0804* (2013.01); *G09G 2310/0202* (2013.01); *G09G 2310/0267* (2013.01); *G09G 2330/04* (2013.01)

(58) Field of Classification Search
   CPC ............ G09G 3/20; G09G 2300/0804; G09G 2310/0202; G09G 2310/0267; G09G 2330/04; G06F 3/0412; H01L 27/0266; H01L 27/124
   See application file for complete search history.

(56) References Cited

U.S. PATENT DOCUMENTS

| 2018/0373079 A1* | 12/2018 | Yeh | H01L 27/124 |
| 2019/0179467 A1* | 6/2019  | Kim | G09G 3/3266 |
| 2019/0304359 A1* | 10/2019 | Liu | G09G 3/3225 |

FOREIGN PATENT DOCUMENTS

CN          108470522 A       8/2018

* cited by examiner

*Primary Examiner* — Abbas I Abdulselam
(74) *Attorney, Agent, or Firm* — Anova Law Group PLLC

(57) ABSTRACT

A display panel and a display apparatus are provided. The display panel includes a substrate; pixel rows including first pixel rows disposed in the first display area and second pixel rows disposed in the second display area; a gate driving circuit including first gate driving units disposed the first non-display area and electrically connected to the first pixel rows, and second gate driving units disposed in the second non-display area and electrically connected to the second pixel rows; touch electrodes disposed in the first display area and the second display area; and a touch electrode detection circuit including detection units disposed in the second non-display area and electrically connected to the touch electrodes. The second gate driving units and a portion of the detection units are arranged along a first axis; and the first axis is between the first irregularly-shaped boundary and the second irregularly-shaped boundary of the non-display area.

11 Claims, 8 Drawing Sheets

20

DISPLAY PANEL AND DISPLAY APPARATUS

CROSS-REFERENCES TO RELATED APPLICATIONS

This application claims priority of Chinese Patent Application No. 201910359453.6, filed on Apr. 30, 2019, the entire contents of which are hereby incorporated by reference.

FIELD OF THE DISCLOSURE

The present disclosure generally relates to the field of display technology and, more particularly, relates to a display panel and a display apparatus.

BACKGROUND

With the continuous development of science and technology, the display apparatus having a display panel has become more and more widely used, and users' requirements for the display panels are more and more diversified. The users are no longer only satisfied with the normal specifications of the display panel, such as large size, and high definition, etc., the requirements for the shape of the display panel have also become more and more diverse. Thus, irregularly-shaped display panels have been developed.

The irregularly-shaped display panel breaks through the limitation of the single rectangular structure of the display panel, which not only makes the display effect more diverse, but also makes the applications of the display panel wider and wider. The irregularly-shaped display panel has been successfully applied to the wearable electronics, such as watches, glasses or smart bracelets, etc. Comparing with conventional display panels, the major difference of the irregularly-shaped display panel is that its display area presents a non-rectangular special shape.

When the display area presents a non-rectangular special shape, for example, when the display area includes an irregularly-shaped edge, the corresponding non-display area will also exhibit an irregularly-shaped structure. When the non-display area exhibits an irregularly-shaped structure, how to reasonably arrange the original circuit structures in the non-display area has become one of the major technical challenges. The disclosed display panel and display apparatus are directed to solve one or more problems set forth above and other problems in the art.

BRIEF SUMMARY OF THE DISCLOSURE

One aspect of the present disclosure provides a display panel. The display panel may include a display area and a non-display area surrounding the display area. The display area may include a first display area and at least a second display area. Each second display area may have an irregularly-shaped edge; and the non-display area may include a first non-display area located in a peripheric area of the first display area and a second non-display area located in a peripheric area of the second display area and the second non-display area may have a irregularly-shaped non-display area. Further, the display panel may include a substrate; a plurality of pixel rows, including first pixel rows disposed in the first display area and second pixel rows disposed in the second display area; a gate driving circuit, including a plurality of first gate driving units disposed in the first non-display area and electrically connected to the first pixel rows, and a plurality of second gate driving units disposed in the second non-display area and electrically connected to the second pixel rows; a plurality of touch electrodes, disposed in the first display area and the second display area; and a touch electrode detection circuit, including a plurality of detection units disposed in the second non-display area and electrically connected to the plurality of the touch electrodes in a one-on-one correspondence. The non-display area may include a first irregularly-shaped boundary and a second irregularly-shaped boundary opposite to the first irregularly-shaped boundary; and the second gate driving units and a portion of the detection units may be arranged along a first axis in the non-display area. The first axis may be between the first irregularly-shaped boundary and the second irregularly-shaped boundary.

Another aspect of the present disclosure provides a display apparatus. The display apparatus may include a display panel. The display panel may include a display area and a non-display area surrounding the display area. The display area may include a first display area and at least a second display area. Each second display area may have an irregularly-shaped edge; and the non-display area may include a first non-display area located in a peripheric area of the first display area and a second non-display area located in a peripheric area of the second display area and the second non-display area may have a irregularly-shaped non-display area. Further, the display panel may include a substrate; a plurality of pixel rows, including first pixel rows disposed in the first display area and second pixel rows disposed in the second display area; a gate driving circuit, including a plurality of first gate driving units disposed in the first non-display area and electrically connected to the first pixel rows, and a plurality of second gate driving units disposed in the second non-display area and electrically connected to the second pixel rows; a plurality of touch electrodes, disposed in the first display area and the second display area; and a touch electrode detection circuit, including a plurality of detection units disposed in the second non-display area and electrically connected to the plurality of the touch electrodes in a one-on-one correspondence. The non-display area may include a first irregularly-shaped boundary and a second irregularly-shaped boundary opposite to the first irregularly-shaped boundary; and the second gate driving units and a portion of the detection units may be arranged along a first axis in the non-display area. The first axis may be between the first irregularly-shaped boundary and the second irregularly-shaped boundary.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
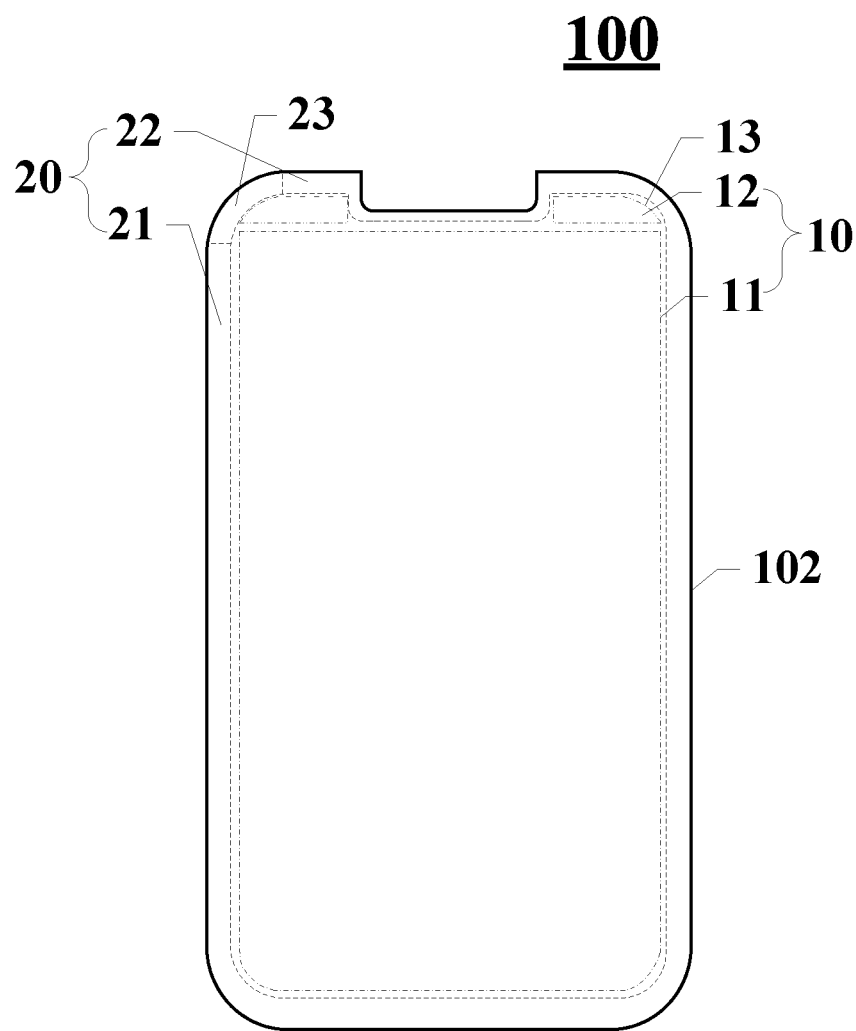
FIG. 1 illustrates an exemplary display panel consistent with various disclosed embodiments.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods, and apparatus that are understandable to the persons of ordinary skill in the art may not be described in detail. However, under appropriate conditions, such techniques, methods and apparatus are also included as the parts of the description.

In the disclosed embodiments, specific values may be explained for illustrative purposes and might not be used as limitations. Thus, embodiments may have different specific values.

Further, the similar symbols and letters in the drawings may denote similar elements. Thus, once one element is defined in one drawing, it may not need to be defined in the following drawings.

The irregularly-shaped display panel breaks through the limitation of the single rectangular structure of the display panel, which not only makes the display effect more diverse, but also makes the applications of the display panel wider and wider. The irregularly-shaped display panel has been successfully applied to the wearable electronics, such as watches, glasses or smart bracelets, etc. Comparing with conventional displays, the major difference of the irregularly-shaped display panel is that its display area presents a non-rectangular special shape.

Figure 2:
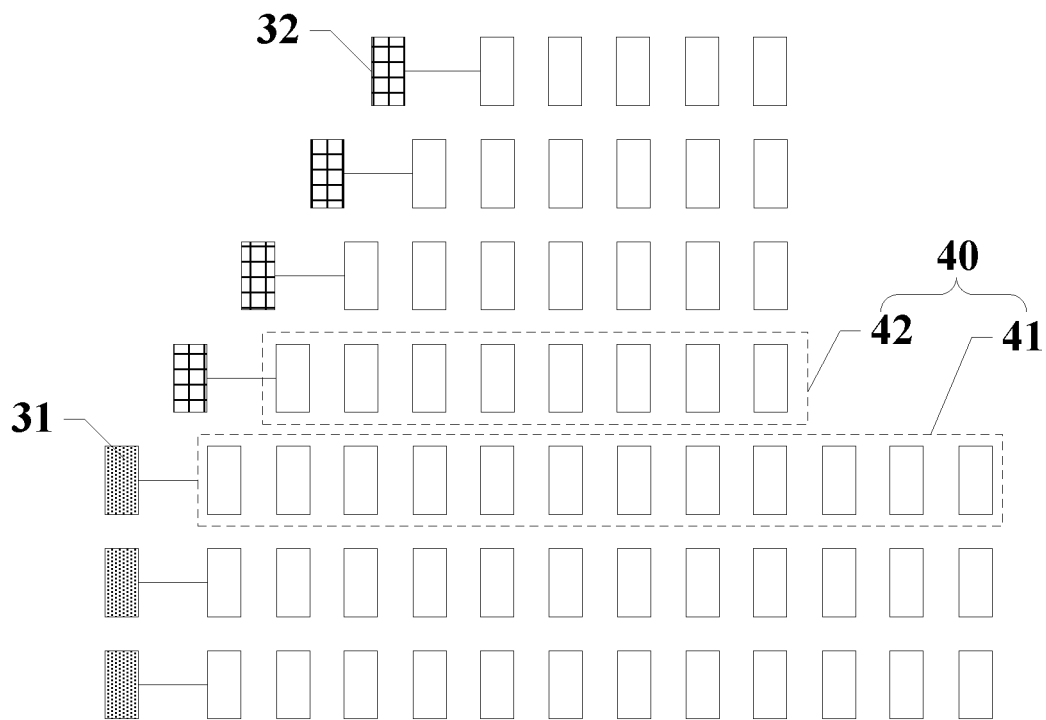
FIG. 2 illustrates an exemplary circuit diagram corresponding to pixel rows in a display panel consistent with various disclosed embodiments.
Figure 3:
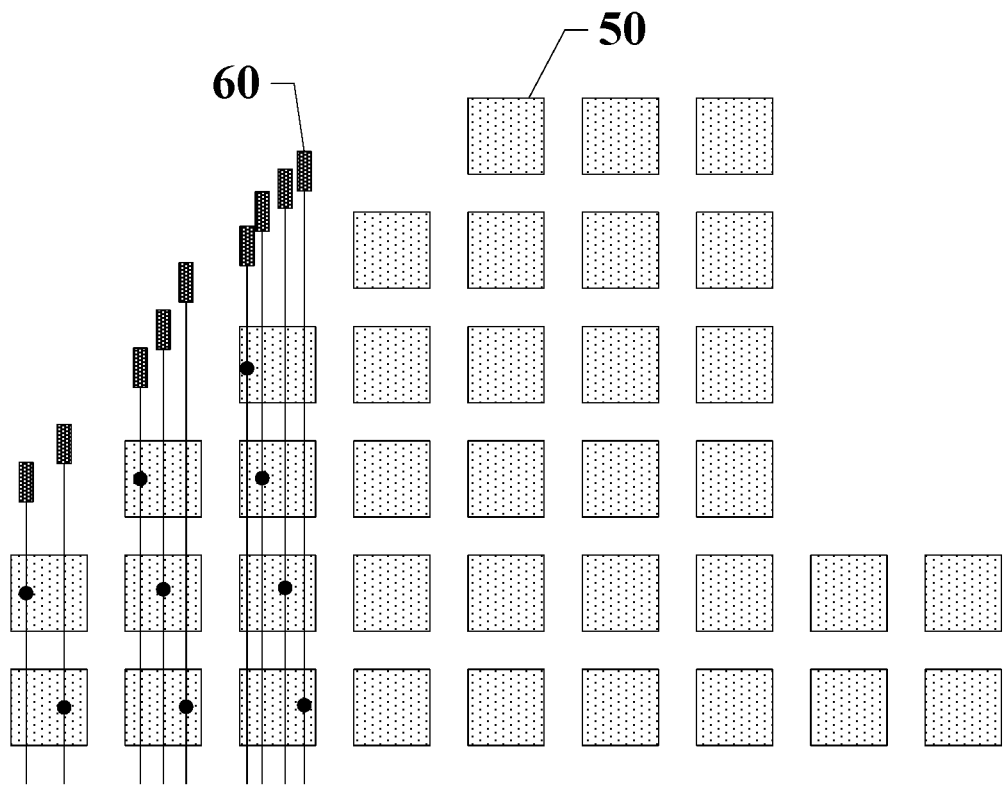
FIG. 3 illustrates an exemplary circuit diagram corresponding to pixel electrodes in a display panel consistent with various disclosed embodiments.
Figure 4:
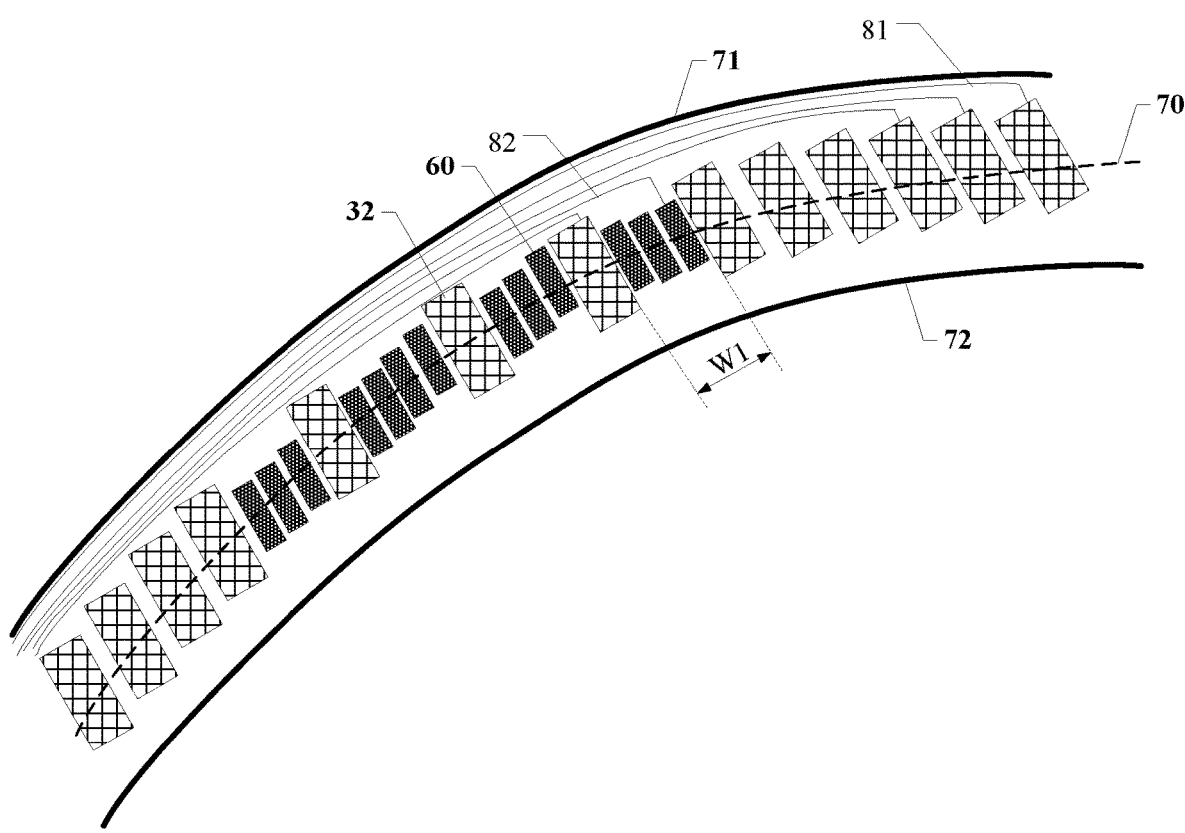
FIG. 4 illustrates an exemplary partial enlargement drawing of an irregularly-shaped non-display area of a display panel consistent with various disclosed embodiments.

When the display area presents a non-rectangular special shape, for example, when the display area includes an irregularly-shaped edge, the corresponding non-display area will also exhibit an irregularly-shaped structure. When the non-display area exhibits an irregularly-shaped structure, how to reasonably arrange the original circuit structure in the non-display area has become one of the major technical challenges The present disclosure provides a display panel. FIG. 1 illustrates an exemplary display panel consistent with various disclosed embodiments. FIG. 2 illustrates an exemplary circuit diagram corresponding to pixel rows in the display panel consistent with various disclosed embodiments. FIG. 3 illustrates an exemplary circuit diagram corresponding to pixel electrodes in the display panel consistent with various disclosed embodiments. FIG. 4 illustrates an exemplary partial enlargement drawing of an irregularly-shaped non-display area of the display panel consistent with various disclosed embodiments.

As shown in FIGS. 1-4, the present disclosure provides a display panel 100. The display panel 100 may include a display area 10 and a non-display area 20 surrounding the display area 10. The display area 10 may include a first display area 11 and at least one second display area 12. The second display area 12 may include an irregularly-shaped edge 13. The non-display area 20 may include a first non-display area 21 located at the peripheric area of the first display area 11 and a second non-display area 22 located at the peripheric area of the second display area 12. The second non-display area 22 may include an irregularly-shaped non-display area 23.

Further, the display panel 100 may include a substrate 102; and a plurality of pixel rows 40. As shown in FIG. 2, the plurality of pixel rows 40 may include first pixel rows 41 disposed in the first display area 11, and second pixel rows 42 disposed in the second display area 12.

Further, the display panel 100 may include a gate driving circuit. As shown in FIG. 2, the gate driving circuit may include a plurality of first gate driving units 31 disposed in the first non-display area 21 and a plurality of second gate driving units 32 disposed in the second non-display area 22. The first gate driving units 31 may be electrically connected to the first pixel rows 41; and the second gate driving unit 32 may be electrically connected to the second pixel rows 42.

Further, as shown in FIG. 3, the display panel 100 may include a plurality of touch electrodes 50. The plurality of touch electrodes 50 may be disposed in the first display area 11 and the second display area 12.

Further, as shown in FIG. 3, the display panel 100 may include a touch electrode detection circuit. The touch electrode detection circuit may include a plurality of detection units 60, and the detection units 60 may be electrically connected to the touch electrodes 50 in a one-to-one correspondence.

Further, as shown in FIG. 4, the irregularly-shaped non-display area 23 may include a first irregularly-shaped boundary 71 and a second irregularly-shaped boundary 72 opposite to the first irregularly-shaped boundary 71. The second gate driving units 32 and at least a portion of the detection units 60 may be arranged along the first axis 70 in the irregularly-shaped non-display area 23. For example, a certain number of the plurality of detection units 60 may be arranged along the first axis 70. The first axis 70 may be located between the first irregularly-shaped boundary 71 and the second irregularly-shaped boundary 72.

It should be noted that FIG. 1 illustrates a contour structure of the display panel 100, including a first display area 11 and two second display areas 12, which only shows the relative position relationship between the first display area 11 and the second display area 12; and does not represent the actual size and number of the first display area 11 and the second display area 12. In some other embodiments of the present disclosure, the first display area 11 and the second display area 12 may also have other numbers and arrangements; and the numbers and the arrangement of the first display area 11 and the second display area 12 are not specifically limited in the present disclosure.

FIG. 2 only schematically shows several pixel rows 40 disposed in the first display area 11 and the second display area 12 and gate driving units corresponding to the pixel rows 40. In some embodiments, there may be dozens or even hundreds of rows of pixel rows 40 disposed in the second display area 12. There may be hundreds or even thousands of pixel rows 40 disposed in the first display area 11. FIG. 2 is merely for illustrative purposes and does not represent the actual size and the number of the pixel rows. Similarly, FIG. 3 also shows only a few touch electrodes 50 disposed in the first display area 11 and the second display area 12 and detection units 60 corresponding to the touch electrodes 50; and does not represent the actual size and the number of the touch electrodes 50. In fact, each of the touch electrodes 50 may be electrically connected to a corresponding detection unit 60. FIG. 3 only shows a schematic view of the connections between the touch electrodes 50 and the detection units 60, and the connection relationships between other touch electrodes 50 and detection units 60 may be performed similarly.

The display panel 100 having the contour structure illustrated in FIG. 1 will be described as an example. The display panels with other contour structures including a first display area and at least one second display area with an irregularly-shaped edge can be referred to FIG. 1.

In particular, as shown in FIGS. 1-4, the display panel 100 provided by the present disclosure may include the first display area 11 and two second display areas 12 adjacent to the first display area 11. The second display area 12 may include an irregularly-shaped edge 13. In one embodiment, the irregularly-shaped edge 13 is a curved edge. In some embodiments, the irregularly-shaped edge 13 may also be a shape of structure other than a curve-shaped structure; and the shape of the irregularly-shaped edge 13 is not limited by the present disclosure. The first gate driving unit 31 may be disposed in the first non-display area 21; and may provide driving signals to the first pixel row 41. The second gate driving unit 32 may be disposed in the second non-display area 22; and may provide driving signals to the second pixel row 42. During the touch electrode detection phase, the detection unit 60 electrically connected to the touch electrode 50 may provide a detection signal to a corresponding touch electrode 50.

On the display panel 100, the detection units 60 electrically connected to a portion of the touch electrodes 50 may be disposed in the irregularly-shaped non-display area 23. In particular, referring to FIG. 4, in the irregularly-shaped non-display area 23, the second gate driving units 32 and at least a portion of the detection units 60 may be arranged along the first axis 70. The first axis 70 may be a line between the first irregularly-shaped boundary 71 and the second irregularly-shaped boundary 72 of the irregularly-shaped non-display area 23. For example, the first axis 70 may be a line located in the middle of the first irregularly-shaped boundary 71 and the second irregularly-shaped boundary 72. The minimum distance between each point of the first axis 70 and the first special shaped boundary 71 may be substantially equal to the minimum distance between the point and the second irregularly-shaped boundary 72. When the second gate driving units 32 and a portion of the detection units 60 may have a rotating arrangement along the first axis 70 in the irregularly-shaped non-display area 23. In particular, the second gate driving units 32 and the portion of the detection units 60 may be arranged along the curvature of the first axis. Using such an arrangement, the space between the first irregularly-shaped boundary 71 in the irregularly-shaped non-display area and the first axis 70 and the space between the second irregularly-shaped boundary 72 in the irregularly-shaped non-display area 23 and the first axis 70 may be saved. Thus, such an arrangement may rationally utilize the space of the irregularly-shaped non-display area 23; and a narrow bezel design of the display panel 100 in the irregularly-shaped non-display area 23 may be realized.

Optionally, referring to FIG. 4, in the irregularly-shaped non-display area 23, a first interval W1 may be included at least two adjacent second gate driving units 32, and at least a portion of the detection units 60 may be disposed in the first interval W1. When the plurality of second gate driving units 32 have a rotating arrange along the first axis 70, a first interval W1 will be formed between at least two adjacent second gate driving units 32. Such an arrangement may be equivalent to interposing a certain number of detection units 60 located in the irregularly-shaped non-display area 23 between the at least two adjacent second gate driving units 32. Further, such an arrangement may not increase the distance between the first irregularly-shaped boundary 71 in the irregularly-shaped non-display area 23 and the first axis 70 and the distance between the second irregularly-shaped boundary 72 in the irregularly-shaped non-display area 23 and the first axis 70. Therefore, the narrow bezel design of the display panel 100 in the irregularly-shaped non-display area 23 may be facilitated.

Figure 5:
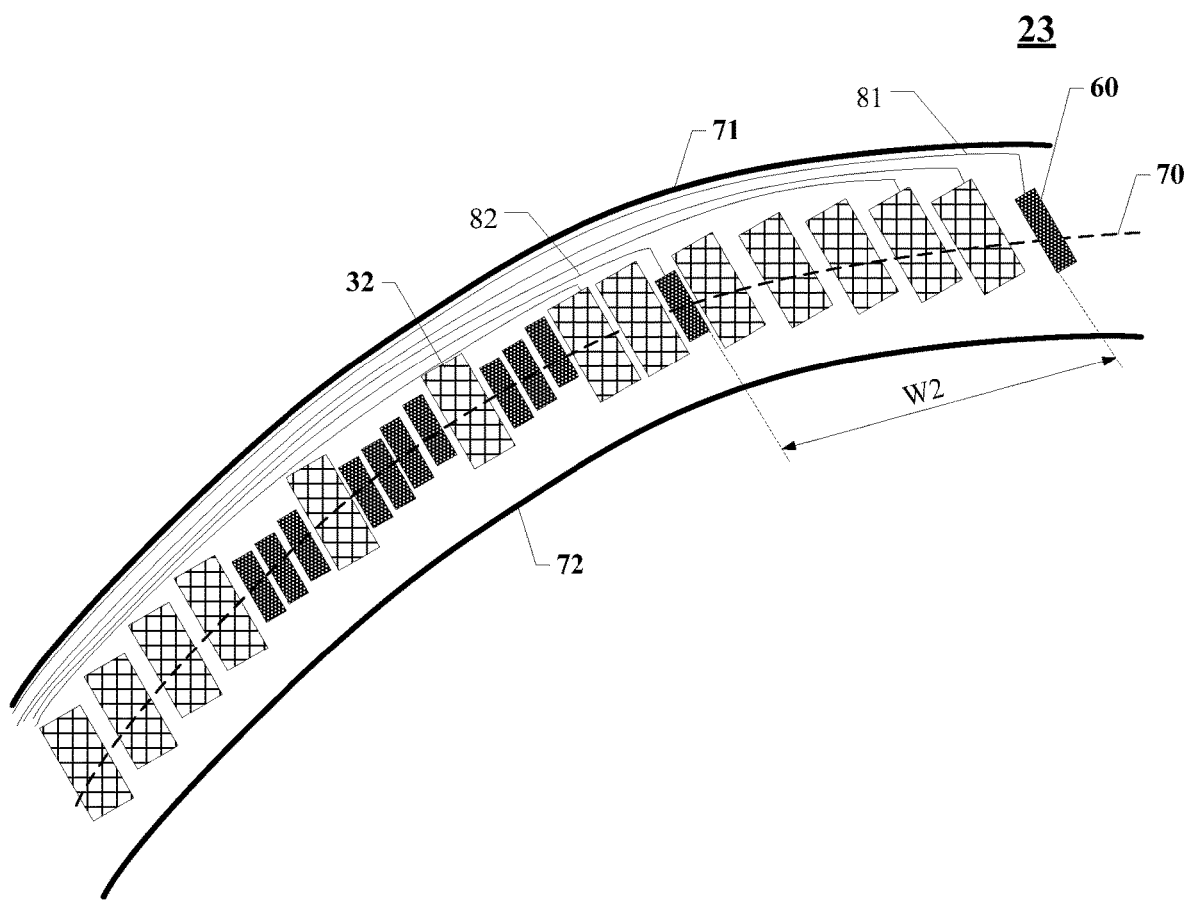
FIG. 5 illustrates another exemplary partial enlargement drawing of an irregularly-shaped non-display area of a display panel consistent with various disclosed embodiments.

FIG. 5 illustrates another exemplary partial enlargement drawing of the irregularly-shaped non-display area 23 of the display panel 100 consistent with various disclosed embodiments. In one embodiment, in the irregularly-shaped non-display area 23, a second interval W2 may be included between at least two adjacent detection units 60; and at least a portion of the second gate driving units 32 may be located in the second interval W2.

In particular, FIG. 5 illustrates another exemplary arrangement of the second gate driving units 32 and the detection units 60 in the irregularly-shaped non-display area 23. In the irregularly-shaped non-display area 23, the second gate driving units 32 and the detection units 60 may have a rotating arrangement along the first axis 70; and the second interval W2 may be formed between at least two adjacent detection units 60; and at least a portion of the second gate driving units 32 may be interposed in the second interval W2. In such an arrangement, the second gate driving units 32 and the detection units 60 may have a rotating arrangement along the same first axis 70, the distance between the first irregularly-shaped boundary 71 and the first axis 70 in the irregularly-shaped non-display area 23 may also not be increased; and the distance between the second irregularly-shaped boundary 72 and the first axis 70 may also not be increased. Thus, a narrow bezel design of the display panel 100 in the irregularly-shaped non-display area 23 may also be facilitated.

Figure 6:
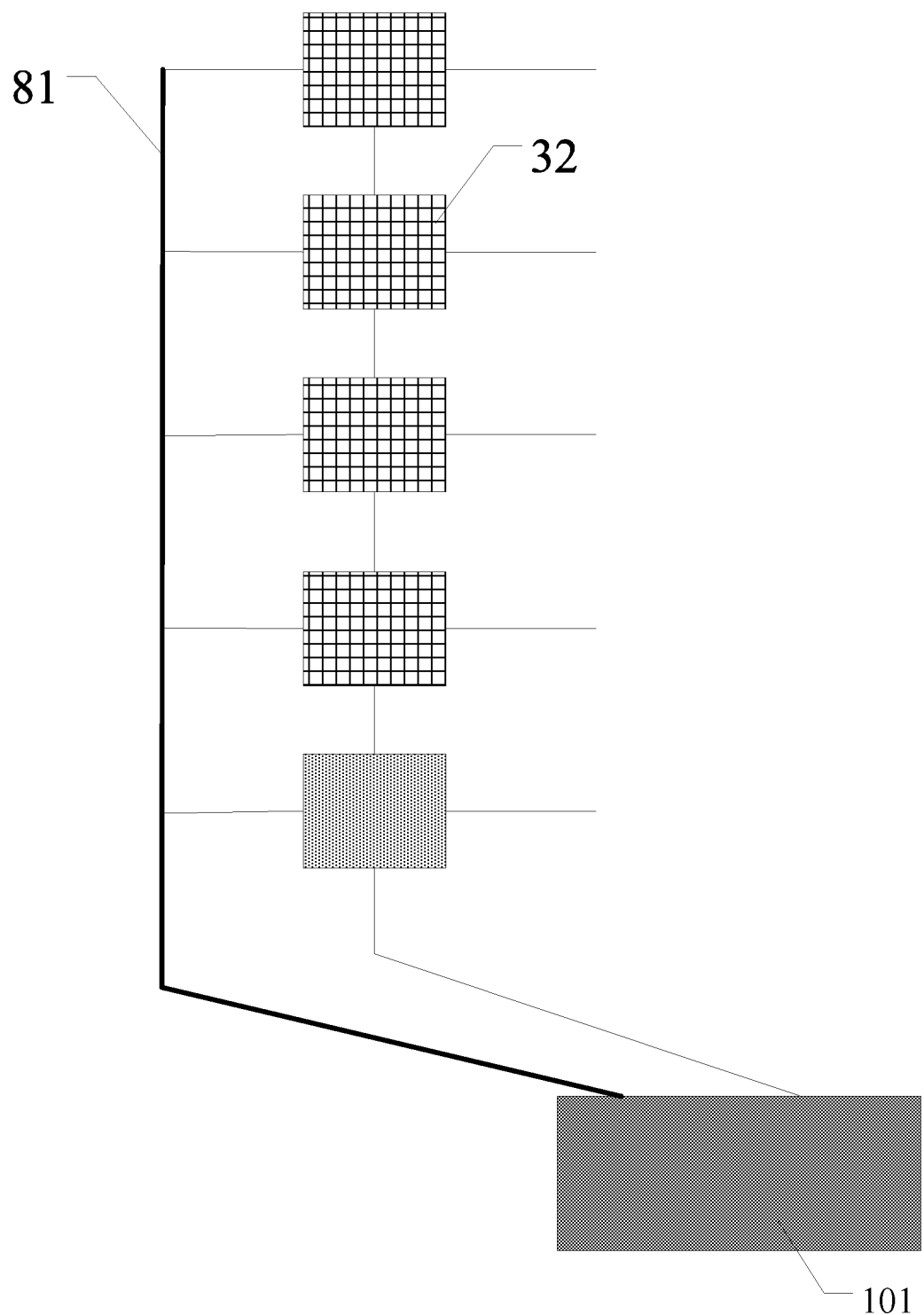
FIG. 6 illustrates an exemplary gate driving circuit of a display panel consistent with various disclosed embodiments.
Figure 7:
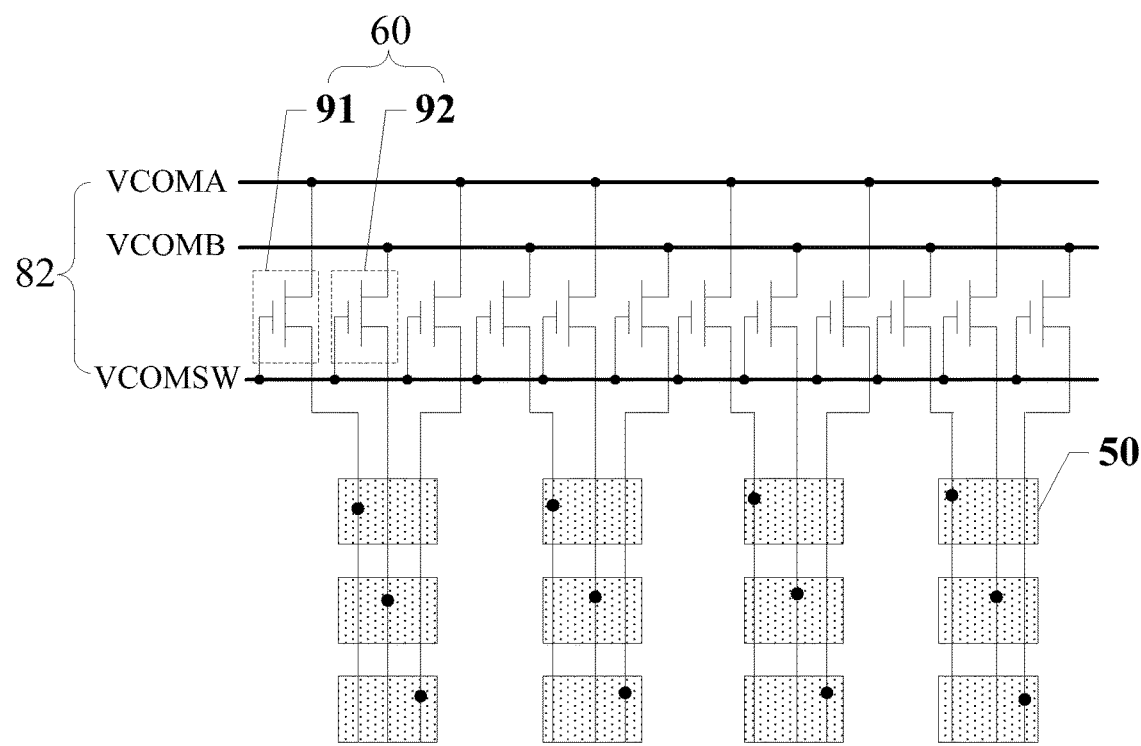
FIG. 7 illustrates an exemplary touch electrode detection circuit of a display panel consistent with various disclosed embodiments.

FIG. 6 illustrates an exemplary driving circuit of a display panel consistent with various disclosed embodiments. FIG. 7 illustrates an exemplary touch electrode detection circuit of a display panel consistent with various disclosed embodiments.

In one embodiment, as shown in FIG. 4 and FIG. 6, the gate driving circuit may further include a plurality of first signal lines 81 electrically connected to the second gate driving units 32. The extending direction of a portion of the first signal line 81 located in the irregularly-shaped non-display area 23 may be the same as the extending direction of the first axis 70.

Further, as shown in FIG. 4 and FIG. 7, the touch electrode detection circuit may include second signal lines 82 electrically connected to the detection units 60. The extending direction of a portion of the second signal line 82 located in the irregularly-shaped non-display area 23 may be the same as the extending direction of the first axis 70.

It should be noted that FIG. 6 only illustrates a connection diagram of the second gate driving units 32 and the first signal lines 81; and may not represent the actual extending direction of the first signal lines 81. In one embodiment, in the irregularly-shaped display area 23, the extending direction of the first signal line 81 may be the same as the extending direction of the first axis 70. Similarly, FIG. 7 only illustrates a connection relationship between the detection unit 60 and the touch electrode 50; and may not represent the actual extending direction of the second signal line 82. In one embodiment, in the irregularly-shaped non-display area 23, the extending direction of the second signal line 82 may be the same as the extending direction of the first axis 70.

As shown in FIG. 4, in one embodiment, in the irregularly-shaped non-display area 23, the extending direction of the first signal line 81 in the first gate driving circuit and the extending direction of the second signal line 82 in the touch electrode detection circuit may be the same as the extending direction of the first axis 70. Such an arrangement of the first signal line 81 and the second signal line 82 in the irregularly-shaped non-display area 23 may reduce the possibility of the overlapping between the first signal lines 81 and the second signal lines 82, and thereby may facilitate to simply the complexity of the layout of the first signal lines 81 and the second signal lines 82.

Further, as shown in FIG. 4, in one embodiment, in the irregularly-shaped non-display area 23, the orthographic projection of the second signal line 82 on the plane where the substrate 102 locates may be located between any two adjacent first signal lines 81. In particular, in the irregularly-shaped non-display area 23 of the display panel 100 provided by the present disclosure, the second signal lines 82 may be located between any two adjacent first signal lines 81, which may be equivalent to interposing the second signal lines 82 between the two adjacent first signal lines 81 according to the arrangement of the first signal lines 81. Such an arrangement of the first signal lines 81 and the second signal lines 82 may be advantageous for reducing the size of the space occupied by the first signal lines 81 and the second signal lines 82 in the irregularly-shaped non-display area 23. Thus, the narrow bezel design of the irregularly-shaped non-display area 23 may be realized.

In one embodiment, as shown in FIG. 6, in the display panel 100 provided by the present disclosure, the first signal line 81 in the gate driving circuit may include at least of one of a clock signal line, a high-level signal line, a low-level signal line, and a trigger signal line. The gate driving unit in the gate driving circuit may be connected to a driving chip 101 through the first signal line 81. When the first signal line 81 is a clock signal line, the driving chip 101 may supply a clock signal to the gate driving unit through the clock signal line. When the first signal line 81 is a high-level signal line, the driving chip 101 may supply a high-level signal to the gate driving unit through the high-level signal line. When the first signal line 81 is a low-level signal line, the driving chip 101 may supply a low-level signal to the gate driving unit through the low-level signal line. When the first signal line 81 is a trigger signal line, the driving chip 101 may supply a trigger signal to the gate driving unit through the trigger signal line. When scanning the pixel rows 40 on the display panel 100, the driving chip 101 may send a startup trigger signal to a first level gate driving unit through the trigger signal line to enable the first level gate driving unit to scan the pixel row 40 connected to the first level gate driving unit. Then, the other pixel driving units cascaded with the first level gate driving unit may sequentially scan the corresponding pixel rows 40; and the progressive scanning of the pixel rows 40 on the display panel 100 may be realized.

It should be noted that FIG. 6 only shows an embodiment in which a first signal line 81 is connected to the gate driving unit by the driving chip 102. In one embodiment, the first signal line 81 may be a general name for a plurality of signal lines and a plurality of types of signal lines. For example, the first signal line 81 may include a plurality of different clock signal lines, and may further include other signal lines, such as trigger signal lines, high-level signal lines, and low-level signal lines, etc. The first level gate driving unit may need to be connected to the trigger signal lines, and each gate driving unit may also be electrically connected to the driving chip through a clock signal line, a high-level signal line, or a low-level signal line, respectively. The specific connection relationships among the gate driving units and the different first signal lines may be set according to the actual situation; and is not specifically limited in the present disclosure.

In one embodiment, as shown in FIG. 7, in the display panel 100 provided by the present disclosure, the second signal line 82 may include a first common voltage signal line VCOMA, a second common voltage signal line VCOMB, and a switch control signal line VCOMSW. In particular, the second signal line 82 introduced in the touch electrode detection circuit may include the first common voltage signal line VCOMA, the second common voltage signal line VCOMB, and the switch control signal line VCOMSW. The on-state of the detection unit 60 may be controlled by the switch control signal line VCOMSW. After the detection unit 60 is turned on, a first common voltage signal may be supplied to the detection unit 60 electrically connected the first common voltage line VCOMA through the first common voltage signal line VCOMA; and thus the detection of the touch electrodes 50 electrically connected to the first common voltage signal line VCOMA may be realized. Further, after the detection unit 60 is turned on, a second common signal may be provided to the detection unit 60 electrically connected the second common voltage signal line VCOMB through the second common voltage signal line VCOMB. The common voltage signal may enable the detection of the touch electrodes 50 electrically connected to the second common voltage signal line VCOMB.

In the present disclosure, one type of voltage signals may be provided to a portion of the touch electrodes 50 through the first common voltage signal line VCOMA, and another type of voltage signals may be provided to another portion of the touch electrodes 50 through the second common voltage signal line VCOMB, respectively, to detect the status of the touch electrodes 50 under two different voltage signals. Thus, whether there is a short circuit among the touch electrodes 50 on the display panel 100 may be detected.

Further, referring to FIG. 7, in one embodiment, the detection unit 60 may include a first transistor 91 and a second transistor 92. The gates of the first transistor 91 and the second transistor 92 may be electrically connected to the switch control signal line VCOMSW, respectively. The first terminal of the first transistor 91 may be electrically connected to the first common voltage signal line VCOMA; and the second terminal of the first transistor 91 may be electrically connected to the touch electrode 50. The first terminal of the second transistor 92 may be electrically connected to the second common voltage signal line VCOMB; and the second terminal of the second transistor 92 may be electrically connected to the touch electrode 50.

In particular, in the display panel 100 provided by the present disclosure, the first transistor 91 and the second transistor 92 may be disposed in the touch electrode detection circuit; and the gates of the first transistor 91 and the second transistor 92 may be respectively controlled by the switch control signal line VCOMSW. The on-state of the first transistor 91 and the second transistor 92 may be controlled by the switch control signal line VCOMSW. The first terminal and the second terminal of the first transistor 91 may also be respectively connected to the first common voltage signal line VCOMA and the touch electrode 50. After the first transistor 91 is turned on, the first transistor 91 may be able to transmit the first common voltage signal on the first common voltage signal line VCOMA to the touch electrode 50 electrically connected to the first common voltage signal line VCOMA. Thus, the detection of such touch electrode 50 may be achieved.

Further, the first terminal and the second terminal of the second transistor 92 may also be respectively connected to the second common voltage signal line VCOMB and the touch electrode 50. After the second transistor 92 is turned on, the second transistor 92 may be able to transmit the second common voltage signal on the second common voltage signal line VCOMB to the touch electrode 50 electrically connected to the second common voltage signal line VCOMB. Thus, the detection of such touch electrode 50 may be achieved.

In one embodiment, the first transistors 91 and the second transistors 92 may share the same switch control signal line VCOMSW, and all the first transistors 91 may share the same first common voltage signal line VCOMA, and all the second transistors 92 may share the same second common voltage signal line VCOMB. In such a configuration, it may not be necessary to provide the first transistors 91 and the second transistors 92 with a plurality of switch control signal lines VCOMSW, a plurality of first common voltage signal lines VCOMA and a plurality of second common voltage signal lines VCOMB. Thus, the complexity of the layout of the touch electrode detection circuit may be simplified to a certain extent, and the space occupied by the signal lines in the touch electrode detection circuit on the display panel 100 may be reduced. Accordingly, the narrow bezel design of the display panel 100 as a whole may be realized.

In one embodiment, in the display panel 100 provided by the present disclosure, any two adjacent touch electrodes 50 may be electrically connected to the first transistor 91 and the second transistor 92, respectively. In particular, any two adjacent touch electrodes 50 on the display panel 100 may be connected to different transistors. Thus, the any two adjacent touch electrodes 50 may be respectively connected to the first common voltage signal line VCOMA and the second common voltage signal line VCOMB. During the process of detecting the touch electrodes 50, when the first common voltage signal and the second common voltage signal are respectively supplied to the adjacent two touch electrodes 50, it may be convenient for observing the change of the brightness of the two adjacent touch electrodes 50. By comparing the two adjacent touch electrodes 50, it may be easier to determine whether the touch electrodes 50 are short-circuited or the position of the short-circuited touch electrodes 50 if the there is a short-circuit. Thus, the detection efficiency of the touch electrodes 50 may be improved.

Figure 8:
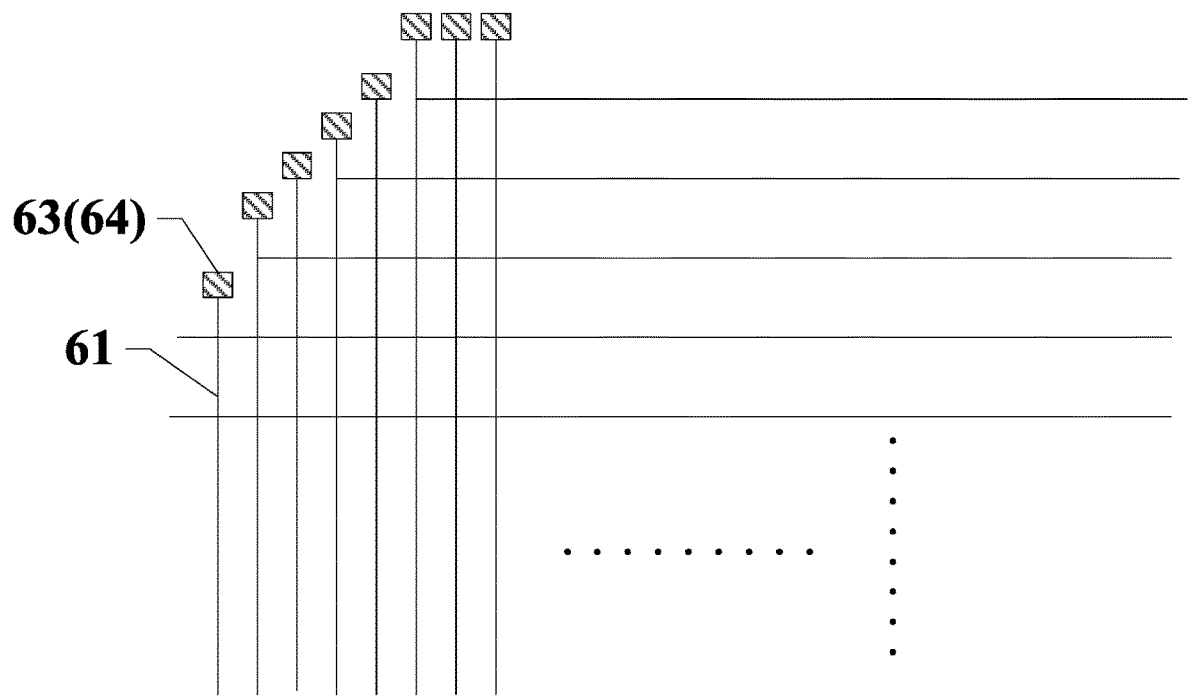
FIG. 8 illustrates an exemplary connection between an electrostatic protection unit and a data line of a display panel consistent with various disclosed embodiments.
Figure 9:
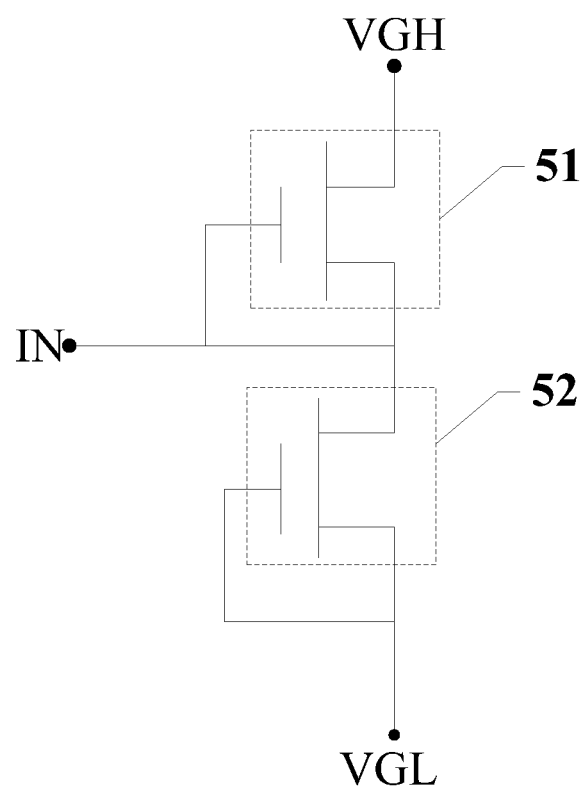
FIG. 9 illustrates an exemplary electrostatic protection unit consistent with various disclosed embodiments.

FIG. 8 illustrates a schematic diagram of a connection between an electrostatic protection unit and a data line in the display panel 100 consistent with various disclosed embodiments. FIG. 9 illustrates an electrostatic protection unit in the display panel 100 according to various disclosed embodiments.

As shown in FIG. 8 and FIG. 9, and referring to FIG. 1 and FIG. 4, the display panel 100 provided by the present disclosure may further include an electrostatic protection circuit disposed in the non-display area 20 and a plurality of data lines disposed in the display area 10. The electrostatic protection circuit may include a plurality of electrostatic protection units 64, and the electrostatic protection units 64 may be electrically connected to the data lines in a one-to-one correspondence.

The data lines may include first data lines 61, at least portions of the line segments of the first data lines 61 may be located in the second display area 12, and the electrostatic protection units may include first electrostatic protection units 63 electrically connected to the first data lines 61. At least a portion of the first electrostatic protection units 63 may be arranged along the first axis 70 in the irregularly-shaped non-display area 23.

FIG. 8 only illustrates one connection relationship between the first electrostatic protection units 63 and the first data lines 61; and does not represent an actual arrangement. In one embodiment, at least a portion of the first electrostatic protection units 63 may be arranged along the first axis 70 in the irregularly-shaped non-display area 23. The corresponding arrangement may be referred to FIG. 4. Such an arrangement may enable a portion of the first electrostatic protection units 63 and the second gate driving units 32 and at least the portion of the detection units 60 to have a rotating arrangement along the first axis 70 in the irregularly-shaped non display area. Thus, after the first electrostatic protection units 63 are incorporated into the irregularly-shaped non-display area 23, the space between the first irregularly-shaped boundary 71 and the first axis 70 in the irregularly-shaped non-display area 23 may be saved. The space between the second irregularly-shaped boundary 72 and the first axis 70 in the irregularly-shaped non-display area 23 may also be saved. Thus, the narrow bezel design of the display panel 100 may also be facilitated.

The detailed configuration of the first electrostatic protection unit 64 may be referred to FIG. 9. The first electrostatic protection unit 63 may include two switching transistors, which may be a first switching transistor 51 and a second switching transistor 52, respectively. The first terminal of the first switching transistor 51 may be electrically connected to the VGH in the display panel 100. The gate and the second terminal of the first switching transistor 51 may be electrically connected as the input terminal IN of the first electrostatic protection unit 63. The input terminals IN may be electrically connected to the data lines in a one-to-one correspondence. The first terminal of the second switching transistor 52 may be electrically connected to the second terminal of the first switching transistor 51, and the gate and the second terminal of the second switching transistor 52 may be electrically connected to VGL in the display panel 100.

Generally, the electrostatic charges on the display panel 100 may be embodied as a high positive voltage or a high negative voltage. When a high positive voltage appears at the input terminal IN, the first switching transistor 51 may be turned on, and a high positive voltage may be conducted away through the VGH terminal, and the effect of the high positive voltage to the light-emitting of the pixel may be effectively avoided. When the input terminal IN exhibits a high negative voltage, the second switching transistor 52 may be turned on, and the high negative voltage may be conducted away through the VGL terminal, the influence of the high negative voltage on the light-emitting of the pixel may be effectively avoided. It should be noted that the VGH terminal may be, for example, a high-level signal line disposed in the non-display area 20, and the VGL terminal may be, for example, a low-level signal line disposed in the non-display area 20.

FIG. 9 illustrates only a schematic diagram showing a configuration of the first electrostatic protection unit 63 in the present disclosure. In some other embodiments, the first electrostatic protection unit 63 may also adopt other appropriate structure; and the configuration of the first electrostatic protection unit 63 is not specifically limited in the present disclosure.

Figure 10:
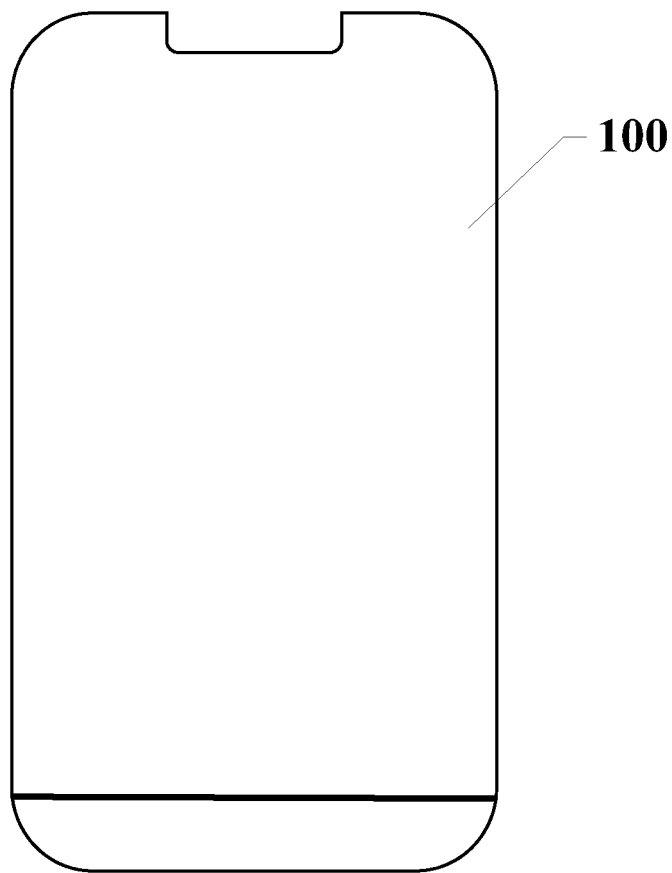
FIG. 10 illustrates an exemplary display apparatus consistent with various disclosed embodiments.

The present disclosure also provides a display apparatus. FIG. 10 illustrates an exemplary display apparatus consistent with various disclosed embodiments.

As shown in FIG. 10, the display apparatus 200 may include a display panel 100. The display panel 100 may be any display panel provided by the present disclosure or other appropriate display panel. The details of the display apparatus 200 and the display panel 100 may be referred to the previous described embodiments of the display panel 100. The display apparatus may be any apparatus product or component having a display function, such as a mobile phone, a tablet computer, a television, a display, a notebook computer, or a navigation system, etc.

The disclosed display panel and the display apparatus may be achieved at least the following beneficial effects.

In the display panel and the display device provided by the present disclosure, the second display area may include an irregularly-shaped edge, and the second non-display area may include an irregularly-shaped non-display area. The first gate driving units electrically connected to the first pixel row and the second gate driving units electrically connected to the second pixel rows may be respectively disposed in the non-display area, and at least a portion of the second gate driving units may be disposed in the irregularly-shaped non-display area. In the non-display area, there may also be detection units electrically connected to the touch electrodes, and at least a portion of the detection units may be disposed in the irregularly-shaped non-display area. In particular, in the irregularly-shaped non-display area, the second gate driving units and the a portion of the detection units may have a rotating arrangement along the first axis. The first axis may be located between the first irregularly-shaped boundary and the second irregularly-shaped boundary of the irregularly-shaped non-display area. Such an arrangement may be advantageous for saving the space between the first irregularly-shaped boundary and the first axis in the irregularly-shaped non-display area and is also beneficial for saving the space between the second irregularly-shaped boundary and the first axis in the irregularly-shaped non-display area. Thus, the space of the irregularly-shaped non-display area may be rationally utilized; and the narrow bezel design of the display panel and the display apparatus in the irregularly-shaped non-display area may be facilitated.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising:
a display area and a non-display area surrounding the display area,
wherein:
the display area includes a first display area and at least a second display area, each having an irregularly-shaped edge; and
the non-display area includes a first non-display area located in a peripheric area of the first display area, and a second non-display area located in a peripheric area of the second display area, the second display area having an irregularly-shaped non-display area;
a substrate;
a plurality of pixel rows, including first pixel rows disposed in the first display area and second pixel rows disposed in the second display area;
a gate driving circuit, including a plurality of first gate driving units disposed in the first non-display area and electrically connected to the first pixel rows, and a plurality of second gate driving units disposed in the second non-display area and electrically connected to the second pixel rows;
a plurality of touch electrodes, disposed in the first display area and the second display area; and
a touch electrode detection circuit, including a plurality of detection units disposed in the second non-display area and electrically connected to the plurality of touch electrodes in a one-on-one correspondence,
wherein the non-display area includes a first irregularly-shaped boundary and a second irregularly-shaped boundary opposite to the first special shaped boundary; the second gate driving units and at least portions of the plurality of detection units are arranged along a first axis in the irregularly-shaped non-display area; and the first axis is disposed between the first irregularly-shaped boundary and the second irregularly-shaped boundary.

2. The display panel according to claim 1, wherein:
in the irregularly-shaped non-display area, a first interval is included between at least two adjacent second gate driving units; and
at least a portion of the plurality of detection units are disposed in the first interval.

3. The display panel according to claim 1, wherein:
in the irregularly-shaped non-display area, a second interval is included between at least two adjacent detection units; and
at least a portion of the second gate driving units are disposed in the second interval.

4. The display panel according to claim 1, wherein:
the gate driving circuit further includes a plurality of first signal lines electrically connected to the second gate driving units; and an extending direction of a portion of the first signal line located in the irregularly-shaped non-display area is the same as an extending direction of the first axis; and
the touch electrode detection circuit further includes a plurality of second signal lines electrically connected to the detection units; and an extending direction of a portion of the second signal line located in the irregularly-shaped non-display area is the same as the extending direction of the first axis.

5. The display panel according to claim 4, wherein:
in the irregularly-shaped non-display area, an orthographic projection of the second signal line on a plane where the substrate locates is between any two adjacent first signal lines.

6. The display panel according to claim 4, wherein:
the first signal line includes at least one of a clock signal line, a high-level signal line, a low-level signal line and a trigger signal line.

7. The display panel according to claim 4, wherein:
the second signal lines include a first common voltage signal line, a second common voltage signal line and a switch control signal line.

8. The display panel according to claim 7, wherein:
the detection unit includes a first transistor and a second transistor;
gates of the first transistor and the second transistor are electrically connected to the switch control signal line, respectively;
a first terminal of the first transistor is electrically connected to the first common voltage signal line;
a second terminal of the first transistor is electrically connected to the touch electrode;
a first terminal of the second transistor is electrically connected to the second common voltage signal line; and
a second terminal of the second transistor is electrically connected to the touch electrode.

9. The display panel according to claim 8, wherein:
any two adjacent touch electrodes are electrically connected to the first transistor and the second transistor, respectively.

10. The display panel according to claim 1, further comprising:
an electrostatic protection circuit having a plurality of electrostatic protection units disposed in the non-display area; and
a plurality of data lines electrically connected to the electrostatic protection units in a one-on-one correspondence and disposed in the display area,
wherein:
the data lines include first data lines;
at least segments of the first data lines are disposed the second display area;
the electrostatic protection unit includes a first electrostatic protection unit electrically connected to the first data line; and
at least a portion of the first electrostatic protection units are arranged in the irregularly-shaped non-display area along the first axis.

11. A display apparatus, comprising:
a display area and a non-display area surrounding the display area,
wherein:
the display area includes a first display area and at least a second display area, each having an irregularly-shaped edge; and
the non-display area includes a first non-display area located in a peripheric area of the first display area, and a second non-display area located in a peripheric area of the second display area, the second display area having an irregularly-shaped non-display area;
a substrate;
a plurality of pixel rows, including first pixel rows disposed in the first display area and second pixel rows disposed in the second display area;
a gate driving circuit, including a plurality of first gate driving units disposed in the first non-display area and electrically connected to the first pixel rows, and a plurality of second gate driving units disposed in the second non-display area and electrically connected to the second pixel rows;
a plurality of touch electrodes, disposed in the first display area and the second display area; and
a touch electrode detection circuit, including a plurality of detection units disposed in the second non-display area and electrically connected to the plurality of touch electrodes in a one-on-one correspondence,
wherein the non-display area includes a first irregularly-shaped boundary and a second irregularly-shaped boundary opposite to the first special shaped boundary; the second gate driving units and at least portions of the plurality of detection units are arranged along a first axis in the irregularly-shaped non-display area; and the first axis is disposed between the first irregularly-shaped boundary and the second irregularly-shaped boundary.

* * * * *